(12) United States Patent
Hofsaess

(10) Patent No.: US 8,642,901 B2
(45) Date of Patent: Feb. 4, 2014

(54) SWITCH HAVING A PROTECTIVE HOUSING AND METHOD FOR PRODUCING SAME

(76) Inventor: Marcel P. Hofsaess, Sondershausen (DE)

( * ) Notice: Subject to any disclaimer, the term of this patent is extended or adjusted under 35 U.S.C. 154(b) by 28 days.

(21) Appl. No.: 13/547,341

(22) Filed: Jul. 12, 2012

(65) Prior Publication Data

US 2013/0014987 A1    Jan. 17, 2013

(30) Foreign Application Priority Data

Jul. 12, 2011 (DE) .......................... 10 2011 107 110

(51) Int. Cl.
*H05K 5/00* (2006.01)
*H01H 37/04* (2006.01)

(52) U.S. Cl.
USPC .............................. 174/521; 337/380; 29/622

(58) Field of Classification Search
USPC ................... 174/521; 337/34, 380; 29/622
See application file for complete search history.

(56) References Cited

U.S. PATENT DOCUMENTS

| | | | | |
|---|---|---|---|---|
| 4,275,432 A * | 6/1981 | Napiorkowski | ............... | 361/124 |
| 4,306,210 A * | 12/1981 | Saur | .................... | 337/2 |
| 4,849,729 A | 7/1989 | Hofsäss | | |
| 5,615,072 A | 3/1997 | Hofsäss et al. | | |
| 5,670,930 A * | 9/1997 | Hofsass et al. | ................. | 337/380 |
| 5,867,085 A * | 2/1999 | Kruck et al. | .................... | 337/380 |
| 5,949,322 A * | 9/1999 | Radbruch et al. | ................ | 337/89 |
| 5,973,587 A | 10/1999 | Hofsäss | | |
| 6,064,295 A * | 5/2000 | Becher et al. | ................. | 337/349 |
| 6,091,316 A | 7/2000 | Hofsäss | | |
| 6,100,784 A | 8/2000 | Hofsäss | | |
| 6,359,440 B2 | 3/2002 | Pohl et al. | | |
| 6,823,580 B2 | 11/2004 | Hofsäss | | |
| 7,049,510 B2 * | 5/2006 | Neuhaeuser et al. | .......... | 174/521 |
| 7,146,721 B2 * | 12/2006 | Hunkeler et al. | ................ | 29/841 |
| 7,795,545 B2 * | 9/2010 | Yamanaka et al. | ............. | 174/528 |
| 2012/0286923 A1 * | 11/2012 | Buettner | ........................ | 337/365 |

FOREIGN PATENT DOCUMENTS

| | | |
|---|---|---|
| DE | 21 21 802 | 1/1973 |
| DE | 26 44 411 | 4/1978 |
| DE | 37 33 693 A1 | 5/1988 |
| DE | 37 10 672 A1 | 10/1988 |
| DE | 44 28 226 C1 | 10/1995 |
| DE | 196 03 310 A1 | 8/1997 |
| DE | 197 08 436 A1 | 9/1998 |
| DE | 197 27 197 A1 | 2/1999 |
| DE | 197 48 589 A1 | 5/1999 |
| DE | 197 54 158 A1 | 5/1999 |
| DE | 101 10 562 C1 | 12/2002 |
| GB | 1 394 612 | 5/1975 |

* cited by examiner

*Primary Examiner* — Hung Ngo
(74) *Attorney, Agent, or Firm* — Harness, Dickey & Pierce, P.L.C.

(57) ABSTRACT

An electrical component has a protective housing. Two connection surfaces for the electrical connection of connecting cables are provided on the component. The connecting cables are provided with a flexible plastic sheath and connected electrically at their first ends to the connection surfaces. The connecting cables protrude with their second ends through a cable bushing out of the protective housing. An additional sheathing is arranged on the plastic sheath of the connecting cables over a first length and is materially connected to the plastic sheath by a firm bond. The cable bushing is manufactured from plastic and is materially connected by a firm bond to the additional sheathing over a second length.

19 Claims, 3 Drawing Sheets

SWITCH HAVING A PROTECTIVE HOUSING AND METHOD FOR PRODUCING SAME

CROSS-REFERENCE TO RELATED APPLICATIONS

This application claims priority to German patent application DE 10 2011 107 110.9, filed Jul. 12, 2011, which is incorporated herein by reference.

FIELD OF THE INVENTION

The present invention relates to a method for surrounding an electrical component with a protective housing, at least two connection surfaces for the electrical connection of connecting cables being provided on the component, said connecting cables being provided with a flexible plastic sheath and being connected electrically with their first ends to the connection surfaces and protruding with their second ends through a cable bushing out of the protective housing.

The present invention also relates to an electrical component with a protective housing, at least two connection surfaces for the electrical connection of connecting cables being provided on the component, said connecting cables being provided with a flexible plastic sheath and being connected electrically with their first end to the connection surfaces and protruding with their second end through a cable bushing out of the protective housing.

BACKGROUND OF THE INVENTION

Such a component and a method for producing same are known from DE 37 33 693 A1.

The known component is a temperature-dependent switch, which, in a known manner, depending on its temperature, produces an electrically conductive connection between the two connection surfaces.

Such temperature-dependent switches are used for being connected in series in the power supply circuit of an electrical appliance to be protected and at the same time for being coupled thermally to the electrical appliance to be protected.

As long as the electrical appliance to be protected is at a temperature which is below a response temperature of the temperature-dependent switch, said switch therefore remains closed and the current flows through the electrical appliance. If the temperature of the electrical appliance now increases to an impermissible value, the switch is opened and the circuit is interrupted.

An example of such a temperature-dependent switch is described, for example, in DE 21 21 802 A1 and DE 196 03 310 A1, the contents of said documents hereby incorporated by reference into the subject matter of the present application.

In the case of the switch known from DE 21 21 802 A1 and DE 196 03 310 A1, a temperature-dependent switching mechanism with a snap-action bimetallic disc and a snap-action spring disc which is supported with its edge on the housing lower part and bears, in the centre, a movable contact part which interacts with a fixed contact part on the cover part of the switch is provided. In this way, an electrically conductive connection between the cover part and the lower part is provided, with in each case one connection surface for the connection of connecting strand wires being provided on the cover part and the lower part.

The snap-action bimetallic disc is enclosed loosely in the switching mechanism below its response temperature and is not involved in the current conduction. If the temperature now increases above the response temperature of the snap-action bimetallic disc, said snap-action bimetallic disc changes its configuration and in the process presses the movable contact part away from the stationary contact part, counter to the force of the snap-action spring disc, with the result that the switch is opened.

If the temperature of the switch is decreased again, with the result that it ultimately decreases to a value below the spring-back temperature of the snap-action bimetallic disc, said bimetallic snap-action bimetallic disc springs back into its original configuration and closes the switch again.

If this automatic closure is undesirable, the known switch can be provided with a so-called self-holding resistor, which is arranged electrically in parallel with the connection surfaces. If the temperature-dependent switch now opens at an excessively high temperature of the electrical appliance to be protected, a residual current flows through this self-holding resistor, which is preferably manufactured from a material with positive temperature coefficients.

In this PTC thermistor, so much ohmic heat is then developed by the residual current that the snap-action bimetallic disc is held at a temperature above its spring-back temperature until the circuit is opened actively.

A temperature-dependent switch with a self-holding function is used in particular when frequent reconnection of the electrical appliance to be protected is undesired or results in damage, such as, for example, in the case of a mechanically jammed wash water pump, whose impeller first needs to be cleaned before the pump can start up again.

Such a self-holding temperature-dependent switch is known from DE 37 10 672 A1.

If the current to be guided through the temperature-dependent switch is in the range of several amperes, the current is conducted preferably no longer via the snap-action spring disc, but via a current transfer element, which is moved by the snap-action spring disc and interacts with two stationary contacts, which are arranged on the cover of the temperature-dependent switch. The operating current of the electrical appliance to be protected flows through this current transfer element.

Such a temperature-dependent switch is known from DE 26 44 411 A1 or DE 197 08 436 A1.

This temperature-dependent switch can also be provided with a self-holding function, as is known, for example, from DE 197 27 197 A1.

Finally, it is also possible to provide said four types of switch, as described above, with a so-called current dependency, with the result that the switches open not only in the event of an excessively high operating temperature of the electrical appliance to be protected, but also at an excessively high operating current. For this purpose, a series resistor is connected in series with the external terminals of the switch, said series resistor heating up in the event of an excessively high current flow to such an extent that the snap-action bimetallic disc is heated to a temperature above its response temperature.

Such current-dependent and temperature-dependent switches are known, for example, from DE 44 28 226 A1 and DE 197 48 589 A1.

All of the above described temperature-dependent switch types can be provided, in accordance with the invention, with a protective housing, as is known from DE 37 33 693 A1 mentioned at the outset.

Although the known temperature-dependent switches already have a housing which protects against the ingress of dust and moisture, in many cases it is still desirable to protect the switch and the electrical connections of the connecting cables to the connection surfaces from aggressive media or else merely from dust and moisture.

That is to say that the known switches are often used in environments in which high mechanical loads, high pressures, high moisture levels or else solvent vapours or vapours from transformer oil etc. occur.

In particular the ingress of moisture, solvent vapours or other gases into the interior of the switch is also disadvantageous because the snap-action bimetallic discs and snap-action spring discs can be attacked thereby and the quality of the contact surfaces on the stationary and movable contact parts can be impaired.

Against this background, DE 37 33 693 A1 proposes introducing the temperature-dependent switch into a metal housing which is then welded shut and using a compression-glass bushing as cable bushing, through which the connecting cables are passed out of the interior of the metal housing.

DE 101 10 562 C1 has disclosed providing particular adhesive-bonding measures in order to seal the interface between the housing lower part and the housing upper part of a temperature-dependent switch.

DE 197 54 158 A1 has disclosed introducing a temperature-dependent switch with a housing and soldered-on connecting lines into a hose-shaped sleeve and then sealing this sleeve at its open end, from which the connecting lines protrude, with the aid of a closure means and under the effect of heat.

However, until now all of these measures have not been able to ensure that gases and liquids nevertheless do not enter the interior of the protective housing, and from there also the housing of the temperature-dependent switch, under loading environmental influences.

These gases and moisture diffuse or creep into the interior of the protective housing at the interfaces between the connecting cables and the cable bushings and between the cable bushings and the protective housings.

SUMMARY OF THE INVENTION

In view of the above, it is one object of the present invention to provide a component and a method of the type mentioned at the outset, in which the protective housing is sealed off hermetically from the outside, although connecting cables lead out of the interior of the protective housing towards the outside. The method should be simple and inexpensive to implement and the component part should have an inexpensive design.

According to the invention, this and other objects are achieved in respect of the method mentioned at the outset by the following steps:

a) the connecting cables are provided with an additional sheathing, which is by firm bond materially connected to the plastic sheath, between the first and second ends of said connecting cables over a first length, b) the connecting cables are then electrically connected with their first end to the connection surfaces, and c) the component is then provided with the protective housing and the cable bushing, the cable bushing manufactured from plastic being by firm bond materially connected to the additional sheathing over a second length.

In respect of the component mentioned at the outset, this and other objects are achieved according to the invention by the fact that an additional sheathing is arranged on the plastic sheath over a first length and is by firm bond materially connected to the plastic sheath, and that the cable bushing is manufactured from plastic and is by firm bond materially connected to the additional sheathing over a second length.

This solution is technically simple and inexpensive to implement and provides a tightly sealed protective housing, with the result that correspondingly equipped switches can be used even in aggressive environments.

The object underlying the invention is thus achieved in its entirety.

That is to say that the inventor of the present application has identified that it is possible by providing an additional sheathing which is simple to produce on the connecting cables to seal off hermetically both the interface to the plastic sheath of the connecting cables and the interface to the cable bushing independently of one another by a firmly bonded material connection between the materials involved.

Although at first glance it appears to be disadvantageous to provide an additional sheathing with consequently an additional interface, this measure results in the protective housing being hermetically sealed.

That is to say that the connecting cables are provided with the additional sheathing before they are soldered or welded to the connection surfaces.

Thus, when applying this additional sheathing, it is not necessary to pay any regard to the electrical component, with the result that corresponding chemical or plastics methods can be used in order to connect the surface of the plastic sheath of the connecting cables by firm bond materially to the plastic material of the additional sheathing.

The plastic material of the additional sheathing can in this case be designed and processed in such a way that, when it is subsequently connected to the cable bushing, which consists of plastic, a firmly bonded connection is likewise produced between the cable bushing and the additional sheathing.

These measures are advantageous in particular when the electrical component is a temperature-dependent switch, which, depending on its temperature, produces an electrically conductive connection between the two connection surfaces, the switch having a housing, on which the connection surfaces are provided.

While the method according to the invention can also be used for sheathing or protecting any desired electrical component having at least two external terminals, said method has particular advantages when the component is the mentioned temperature-dependent switch. With this temperature-dependent switch, it is firstly extremely difficult to seal off its "dedicated" housing, on which the two connection surfaces are provided, to a sufficient extent. That is to say that when sealing off the housing of the temperature-dependent switch, care always needs to be taken as regards the pressure, heat and outgassing of the sealing materials that the sensitive snap-action bimetallic disc and the likewise sensitive snap-action spring disc are not damaged or attacked.

Furthermore, it is important in particular with the temperature-dependent switches that the surface quality of the movable and stationary contact parts is not impaired by corrosion or other influences because this would increase the contact resistance.

Since the bearing forces between the stationary and movable contact parts can only achieve certain values owing to the small dimensions of the temperature-dependent switches, even very small levels of contamination on the contact surfaces can result in the contact resistances becoming so great that the switches are no longer usable.

In addition, owing to the small dimensions of the temperature-dependent switches, even very low mechanical loads or deformations can result in switches no longer operating correctly.

Owing to the fact that an additional sheathing is now provided between the cable bushing and the connecting cable, with said additional sheathing being firmly bonded to the two interfaces, these interfaces are now diffusion-tight. The firmly bonded material connection in this case results in crosslinking between the materials of the plastic sheath, the additional sheathing and the cable bushing.

According to one object, the protective housing is manufactured in one piece from plastic and the cable bushing is formed integrally with the protective housing, for which purpose the protective housing and the cable bushing are preferably produced by a plastic being cast or injection-moulded around the component.

In this case, it is advantageous that the cable bushing is an integral part of the protective housing, with the result that, apart from the interfaces between the cable bushing and the additional sheathing and between the additional sheathing and the connecting cables, there are no further interfaces along which gases or liquids could diffuse into the interior of the protective housing.

In this case, the firmly bonded material connection between the cable bushing and the additional sheathing can be brought about by temperature or pressure and/or by virtue of the fact that the additional sheathing has not yet been polymerized out to a sufficient extent during casting of the protective housing, with the result that the firmly bonded connection between the plastic of the protective housing and the plastic of the additional sheathing is produced without any problems.

Of particular advantage here is the fact that the material of the additional sheathing can be selected such that it is compatible with the plastic sheath of the connecting cables on its inside and with the material of the cable bushing on its outside. For this purpose, provision can be made, for example, for a concentration gradient for the plastic composition to be provided in the sheathing.

According to an alternative object, the component is introduced into the interior of an enveloping housing in such a way that the connecting cables protrude with their second end out of the enveloping housing and that thereafter the cable bushing is formed, preferably the interior of the enveloping housing being at least partially filled with a plastic, which in the process forms the cable bushing.

In this case, the enveloping housing can be a single-part or else two-part enveloping housing comprising an upper form and a lower form, into which the component is introduced before the upper form is placed on top.

In this case, provision can be made for the enveloping housing to be removed again once the interior has been completely or partly filled and the plastic has been utilised appropriately.

These measures represent an alternative to injection-moulding or casting a plastic around the component, which likewise result in a protective housing consisting of plastic, in which the protective housing and the cable bushing are formed integrally with one another.

In specific application cases, the enveloping housing can remain on the protective housing in order to impart a particular mechanical stability to the protective housing or in order to ensure a good thermal connection to the electrical appliance to be protected.

In this embodiment, it is not necessary to completely fill the interior of the enveloping housing with plastic. Some free space may remain between the enveloping housing and the component part. What is important is that the bushing is formed and connected to the enveloping housing as well as to the additional sheathing.

According to still another object, the additional sheathing is by firm bond materially connected to the plastic sheath by adhesive-bonding, welding or vulcanisation, wherein, alternatively, the additional sheathing can also be injection-moulded or cast around the plastic sheath. Finally, it is alternatively possible to press the additional sheathing onto the plastic sheath. With all of these measures, suitable temperatures and pressures can be used.

When applying the additional sheathing to the plastic sheath of the connecting cable, the suitable measures can be used, depending on the material of the plastic sheath and the material of the protective housing which is yet to be produced subsequently, in order to apply a plastic material which is suitable for subsequent further-processing as sheathing on the plastic sheath in a firmly bonded manner.

In this case, conventional materials, such as those which result in flexible plastic lines after curing or polymerizing, which can be laid as desired during connection of the component to an electrical appliance, are used as the material for the plastic sheath of the connecting cables.

As the material for the additional sheathing, in this case thermoplastic materials or reactive resins can be used which enter into a firmly bonded material connection with the respective material of the plastic sheath.

In order to assist in the formation of the firmly bonded connection, the surfaces of the plastic sheath or later the surface of the additional sheathing can be activated mechanically or chemically before the firmly bonded connection is produced.

In this case, it is possible, for example, to mechanically roughen these surfaces, for example to sandblast said surfaces.

Alternatively, it is also possible to chemically activate the surfaces in order to enable crosslinking with the other plastic material.

Such joining methods for two plastics which result in a firmly bonded connection are moreover sufficiently well known from the prior art, with the result that reference should be made to the relevant technical literature.

The same applies to the selection of the plastic materials used; in this case too, the respectively suitable materials can be used.

It is known that the plastic material of the plastic sheath tends to be flexible, while the plastic material of the protective sleeve tends to be stiff and rigid, with the result that the additional sheathing can produce compensation between the flexible material of the connecting cable and the rigid material of the protective housing, which provides further advantages.

In this case, the additional sheathing extends between the first and second ends of the connecting cable over a first length, which is substantially shorter than the length of the connecting cable itself; it is no more than 10% of the length thereof, for example.

The second length over which the additional sheathing is by firm bond materially connected to the cable bushing, on the other hand, corresponds virtually to the length of the first length, but is slightly shorter, with the result that the additional sheathing protrudes out of the protective housing with preferably 10% of its length.

In the context of the present invention, a firmly or materially bonded connection is understood to mean a firmly bonded material connection which is formed over the corresponding length and the entire circumference, with this quite possibly meaning that in the central region of the connecting length this firmly bonded connection is not formed completely, but is rather present at the outer regions of the length. However, the firmly bonded connection is always provided completely in the circumferential direction over the respective length sections, with the result that the interior of the protective sleeve is sealed off from the outside world in diffusion-tight fashion.

The diameter of the additional sheathing is at least slightly larger than the diameter of the connecting cable. The thickness of the additional sheathing in the diameter direction is substantially dependent on the selection of materials, but the diameter of the additional sheathing is generally no greater than three times the diameter of the connecting cable.

Of particular advantage with the present invention is the possibility of optimally processing each diffusion or leakage section, i.e. activating or modifying said section depending on the respective requirements, whether it be mechanically or chemically.

Owing to the fact that the firmly bonded material connection between the additional sheathing and the cable bushing is produced when the connecting cables have already been connected to the component, the material of the additional sheathing is essentially selected such that this "outer" firmly bonded connection can be produced relatively easily and without any damage to the electrical component.

Owing to the fact that the "inner" firmly bonded connection between the additional sheathing and the plastic sheath of the connecting cable is produced as long as the connecting cable has not yet been connected to the component, however, chemically and mechanically more aggressive methods can be used here in order to produce the corresponding materially bonded connection.

In this case, it is possible, for example, to unwind the connecting cable as a cable run from a cable drum and guide it through a corresponding plastic injection-moulding or casting apparatus, in which the surface of the plastic sheath is first pre-treated and is then provided with the additional sheathing. Then, the connecting cable is cut to the desired length and the insulation is stripped at least from its first end, but generally from both of its ends.

It is particularly advantageous here that the component, in particular the temperature-dependent switch, can be completely prefabricated with its housing and the two connection surfaces, with the type and length of the connecting cables only being selected later and depending on the application, then the connecting cables are first provided with the additional sheathing and are brought to length and are then electrically connected to the components and finally surrounded by the protective housing.

This provides the possibility of a very flexible production process, with the result that costs are correspondingly low.

Further advantages result from the description and the attached drawing

It goes without saying that the features which are mentioned above and are yet to be explained below can be used not only in the respectively given combination, but also in other combinations or on their own, without leaving the scope of the present invention.

BRIEF DESCRIPTION OF THE DRAWINGS

Embodiments of the invention are illustrated in the attached drawing and will be explained in more detail in the description below. In the drawing.

DESCRIPTION OF PREFERRED EMBODIMENTS

Figure 1:
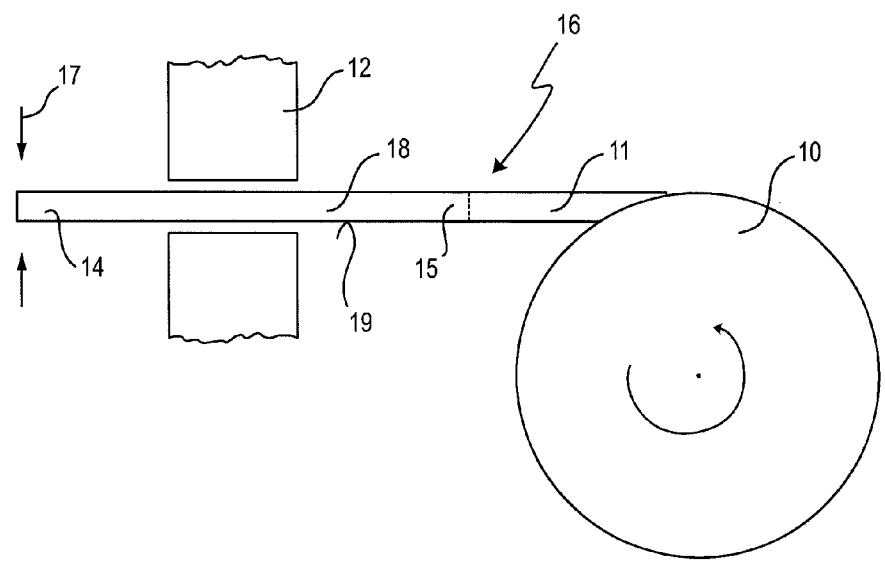
FIG. 1 shows a schematic side view of the production of connecting cables from a continuous cable.

In FIG. 1, 10 denotes a cable drum, on which a continuous cable 11 has been wound.

Figure 2:
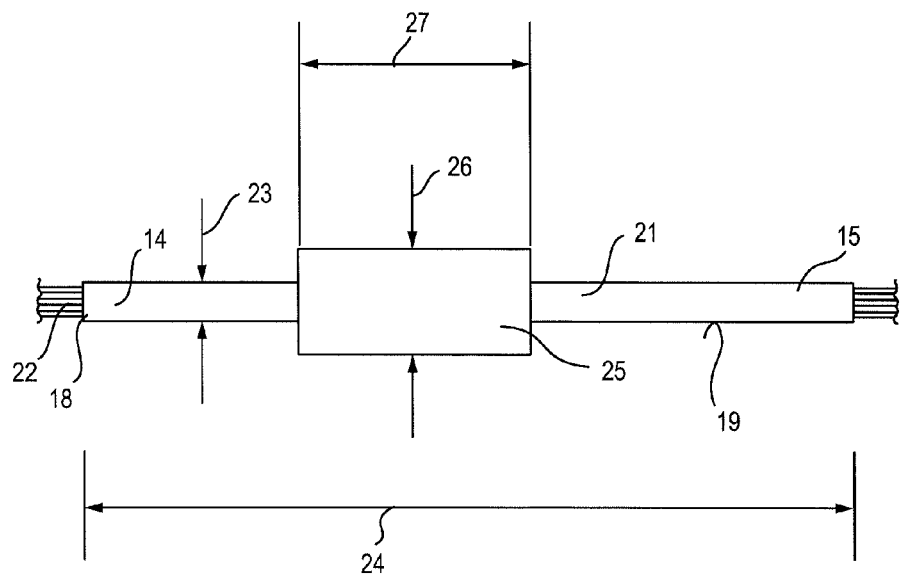
FIG. 2 shows a schematic side view of a connecting cable which has been provided with an additional sheathing and has been cut to length.

The continuous cable 11 is drawn through an apparatus 12, in which it is mechanically and/or chemically activated or modified and then provided with an additional sheathing consisting of plastic, as is shown in FIG. 2.

For this purpose, the continuous cable 11 is drawn by its first end 14 through the apparatus 12, with a second end 15 still being connected to the continuous cable 11 at a cutting point 16.

The first end 14 is located on a separating apparatus 17, which is used also to sever the second end 15 at the cutting point 16 once the continuous cable has been drawn further through the apparatus 12.

The continuous cable 11 has been provided with a plastic sheath 18, which has a surface 19, which is mechanically or chemically activated or modified in a suitable manner in the apparatus 12 before the additional sheathing is applied.

FIG. 2 shows a connecting cable 21 which has been cut to a corresponding length, in which a strand wire, denoted by 22, is protected by the plastic sheath 18.

The connecting cable 21 has a diameter 23 and a length 24, which are both selected depending on the desired application.

The connecting cable 21 is now provided with an additional sheathing 25 consisting of plastic, which has a diameter 26 and a length 27. The length 27 is markedly shorter than the length 24, and is generally at most 10% of the length 24.

The diameter 26 is at least slightly larger than the diameter 23; in general it is at most from two times to three times the size of the diameter 23.

In the apparatus 12 shown in FIG. 1, the additional sheathing 25 was applied to the surface 19 in such a way that the material of the sheathing 25 entered into a firmly bonded material connection with the material of the plastic sheath 18.

In this case, the additional sheathing 25 can be by firm bond materially connected to the plastic sheath 18 by adhesive-bonding, welding or vulcanisation, with it also being possible for the additional sheathing to be injection-moulded or cast around the plastic sheath 18 or for the additional sheathing to be pressed onto the plastic sheath 18 under pressure and elevated temperature.

Figure 3:
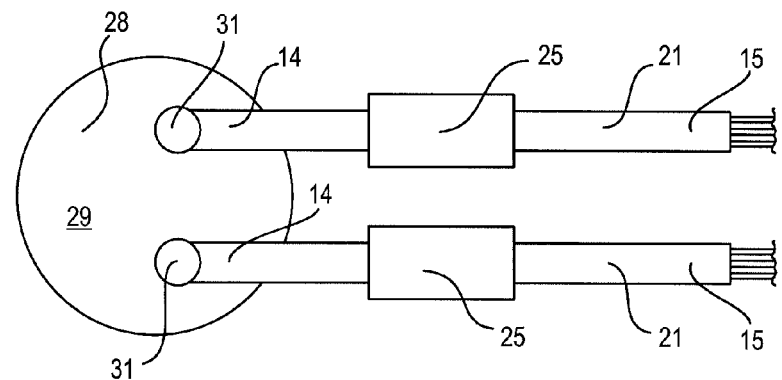
FIG. 3 shows an electrical component which has been provided with two connecting cables shown in FIG. 2.

Once the connecting cables 21 have been produced correspondingly, they are connected to a component 28, as is illustrated in FIG. 3.

The component 28 is preferably a temperature-dependent switch, which has a housing 29, on which two connection surfaces 31 are provided, to which the connecting cables 21 have been soldered or welded with their inner ends 14.

Figure 4:
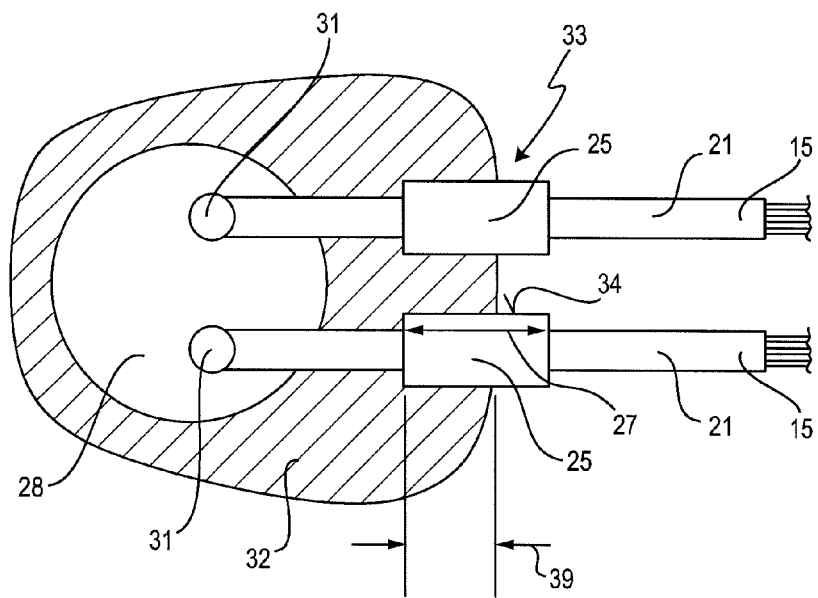
FIG. 4 shows the electrical component shown in FIG. 3, around which a protective housing consisting of plastic has been injection-moulded.

The component 28 which has been prefabricated with connecting cables 21 as shown in FIG. 3, i.e. the correspondingly prefabricated temperature-dependent switch, is now surrounded by a protective housing 32, as is illustrated in FIG. 4.

This protective housing 32 consists of a plastic, which was used for injection-moulding or casting around the component part 28 up to over half the length 27 of the additional sheathing 25. In this case, a cable bushing 33 is produced integrally and in one piece with the protective housing 32, said cable bushing lying circumferentially around the additional sheathings 25 and likewise being by firm bond materially connected thereto.

Before the protective housing 32 is encapsulated by injection-moulding or casting, the surfaces 34 of the additional sheathing 25 can also be treated mechanically or chemically, i.e. activated or modified, in order to ensure a secure material connection to the surface 34.

Alternatively, it is also possible for the component 28 shown in FIG. 3 to be introduced into the interior 35 of an enveloping housing 36 and for the interior 35 then to be completely or partly filled with a plastic 37 in such a way that the cable bushings 33 again form around the additional sheathings 25. This embodiment is shown in FIG. 5.

Figure 5:
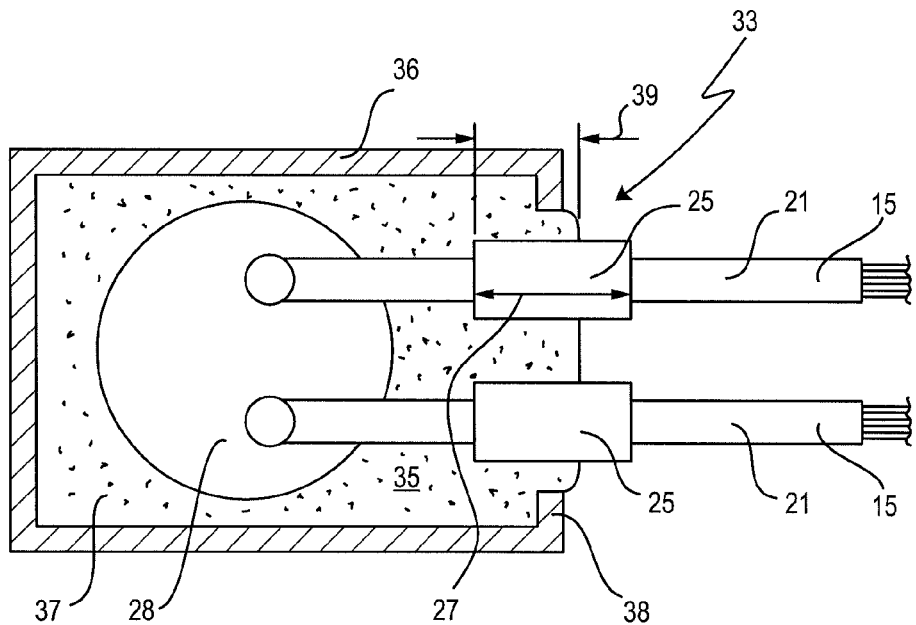
FIG. 5 shows the electrical component shown in FIG. 3 which has been arranged in an enveloping housing which has been filled with a plastic.

Both during the injection-moulding or casting shown in FIG. 4 and in the case of the filling with plastic 37 shown in FIG. 5, it is ensured that firmly bonded connections between the cable bushing 33 and the additional sheathings 25 are formed.

In the embodiment shown in FIG. 5, a flange 38 ensures that the plastic 37 is held in the enveloping housing 36.

If this enveloping housing 36 is no longer required once the plastic 37 has cured, the flange 38 can be removed and the protective housing formed by the plastic material 37 removed out of the enveloping housing 36.

Alternatively, it is also possible to quite completely dispense with the flange 38 in the enveloping housing 36.

FIG. 4 and FIG. 5 also show that the material connection between the cable bushing 33 and the sheathing 25 is produced over a second length 39, which corresponds to markedly more than half the length 27 of the sheathing 25. Preferably, the sheathing 25 protrudes out of the cable bushing 33 only by 10% of its length 27.

Figure 6:
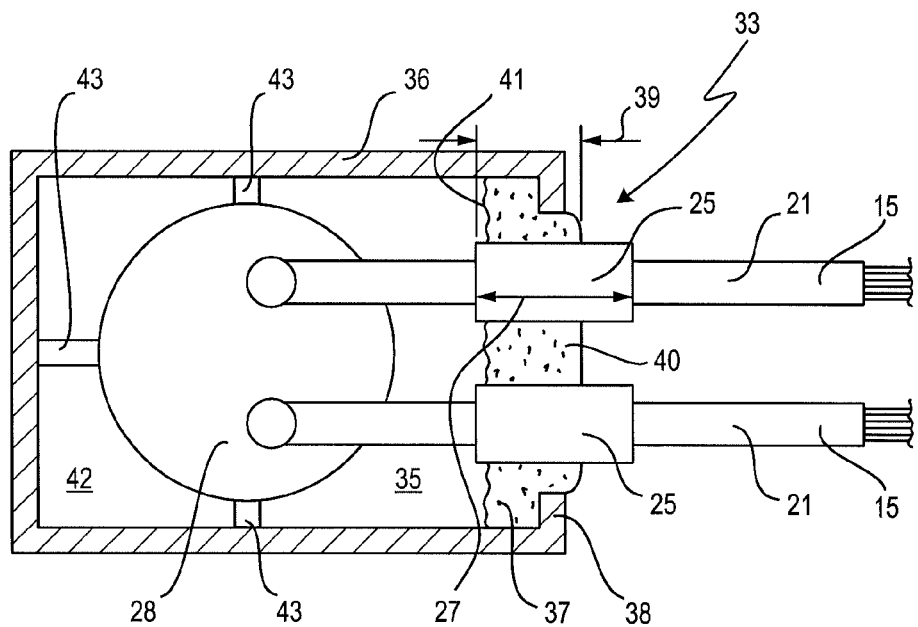
FIG. 6 shows an embodiment as in FIG. 5, but with the enveloping housing not completely filled with plastic.

In a further alternative, it is also possible not to fill the enveloping housing 36 completely with the plastic 37, as is shown in FIG. 6. In this embodiment, only the bushings 33 and some closing cover 40 are formed by the plastic and firmly connected to the enveloping housing 36. The plastic 37 is delimited against the interior 35 of the enveloping housing 36 by a confinement line 41.

Now, between the enveloping housing 36, the confinement line 41 of the plastic 37 and the component part 28 an empty space 42 is produced.

The connection between the cover 40 and the enveloping housing 36 is curved and can be made strong and long enough for protecting the space 42 and preventing dust and moisture entering into the space 42.

The component part 28 may be oriented and hold within the enveloping housing 36 by struts 43. Despite the struts 43, the confinement line 41 and the free space 42, the embodiment of FIG. 6 corresponds to that of FIG. 5.

Therefore, what is claimed is:

1. A method for surrounding an electrical component with a protective housing, at least two connection surfaces for electrically connecting said component being provided on the component, said method comprising the following steps:
   a) providing at least two connecting cables each comprising a first end and a second end and each being provided with a flexible plastic sheath,
   b) providing each connecting cable over a first length between the first end and the second end of the respective cable with an additional sheathing, which additional sheathing is materially connected to the plastic sheath by a firm bond;
   c) electrically connecting each connecting cable at its first end to one of the connection surfaces; and
   d) providing the component with said protective housing and a cable bushing, such that the at least two connecting cables protrude with their second ends through said cable bushing out of the protective housing, whereby said cable bushing is manufactured from plastic and is connected by firm bond materially to the additional sheathing over a second length.

2. The method of claim 1, wherein, in step (d), the protective housing is manufactured in one piece from plastic, and the cable bushing is formed integrally with the protective housing.

3. The method of claim 2, wherein, in step (d), the protective housing and the cable bushing are produced by a plastic being cast or injection-moulded around the component.

4. The method of claim 1, wherein, in step (d), the component is inserted into the interior of an enveloping housing in such a way that the connecting cables protrude with their second ends out of the enveloping housing, and in that thereafter the cable bushing is formed.

5. The method of claim 4, wherein an interior space of the enveloping housing is filled at least partially with a plastic, which in the process forms the cable bushing.

6. The method of claim 5, wherein the enveloping housing is completely filled with said plastic.

7. The method of claim 6, wherein the enveloping housing is removed after the interior has been filled with said plastic, said plastic forming said protective housing.

8. The method of claim 7, wherein, in step (b), the additional sheathing is by firm bond materially connected to the plastic sheath by adhesive-bonding, welding or vulcanisation.

9. The method of claim 4, wherein, in step (b), the additional sheathing is by firm bond materially connected to the plastic sheath by adhesive-bonding, welding or vulcanisation.

10. The method of claim 1, wherein, in step (b), the additional sheathing is by firm bond materially connected to the plastic sheath by adhesive-bonding, welding or vulcanisation.

11. The method of claim 1, wherein, in step (b), the additional sheathing is injection-moulded or cast around the plastic sheath.

12. The method of claim 1, wherein, in step (b), the additional sheathing is pressed onto the plastic sheath.

13. The method of claim 1, wherein, in step (b), an outer surface of the plastic sheath is activated mechanically or chemically, before the plastic sheath is provided with the additional sheathing.

14. The method according of claim 1, wherein, prior to step (d), an outer surface of the additional sheathing is activated mechanically or chemically.

15. The method of claim 1, wherein the electrical component is a temperature-dependent switch, which, depending on its temperature, produces an electrically conductive connection between the two connection surfaces, the switch comprising a housing, on which housing the connection surfaces are provided.

16. An electrical component comprising a protective housing, at least two connection surfaces for electrical connection to the component, a cable bushing, and at least two connecting cables, said connecting cables each being provided with a flexible plastic sheath and each comprising a first end and a second end, each connecting cable being connected electrically at its first end to one of the connection surfaces and protruding with its second end through said cable bushing out of the protective housing, wherein an additional sheathing is arranged over a first length on the plastic sheath of each connecting cable, said additional sheathing being materially connected to the plastic sheath by firm bond, and the cable bushing is manufactured from plastic and is materially connected by firm bond to the additional sheathing over a second length.

17. The electrical component of claim 16, wherein the cable bushing is an integral part of the protective housing.

18. The electrical component of claim 16, wherein the electrical component comprises a temperature-dependent switch, which, depending on its temperature, produces an electrically conductive connection between the two connection surfaces, the switch having a housing, on which the connection surfaces are provided.

19. The electrical component of claim 17, wherein the electrical component comprises a temperature-dependent switch, which, depending on its temperature, produces an electrically conductive connection between the two connection surfaces, the switch having a housing, on which the connection surfaces are provided.

* * * * *